(12) United States Patent
Tsividis (10) Patent No.: US 10,447,243 B2
(45) Date of Patent: Oct. 15, 2019

(54) COMPENSATING FOR THE SKIN EFFECT IN A SHUNT

(71) Applicant: Sendyne Corporation, New York, NY (US)

(72) Inventor: Yannis Tsividis, New York, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 15/766,369

(22) PCT Filed: Dec. 14, 2017

(86) PCT No.: PCT/IB2017/057969
§ 371 (c)(1),
(2) Date: Apr. 6, 2018

(87) PCT Pub. No.: WO2018/109726
PCT Pub. Date: Jun. 21, 2018

(65) Prior Publication Data
US 2018/0316335 A1 Nov. 1, 2018

Related U.S. Application Data

(60) Provisional application No. 62/434,352, filed on Dec. 14, 2016.

(51) Int. Cl.
*H03H 17/02* (2006.01)
*G06F 17/10* (2006.01)
(Continued)

(52) U.S. Cl.
CPC ..... *H03H 17/0219* (2013.01); *G01R 19/0007* (2013.01); *G01R 19/2506* (2013.01);
(Continued)

(58) Field of Classification Search
CPC .......... H03H 17/0219; H03H 17/0202; G01R 19/0007; G01R 19/2506; G06F 17/10
(Continued)

(56) References Cited

U.S. PATENT DOCUMENTS 4,408,147 A * 10/1983 Gabel ..................... H02P 7/298
318/493
4,494,068 A * 1/1985 Ley ......................... H01C 3/02
324/126

(Continued)

FOREIGN PATENT DOCUMENTS

WO 2007058910 A2 5/2007

OTHER PUBLICATIONS

John Reinhart ("Controlling Harmonic Distortion in Power Electronics using Active Power Filters", The University of Minnesota, May 2013, pp. 1-52) (Year: 2013).*

(Continued)

*Primary Examiner* — Kamini S Shah
*Assistant Examiner* — Iftekhar A Khan
(74) *Attorney, Agent, or Firm* — Oppedahl Patent Law Firm LLC (57) ABSTRACT

A method and apparatus to compensate for distortion of a waveform due to the skin effect in a current shunt. The method includes modeling the complex impedance of the shunt as component complex impedances. By designing a filter corresponding to the component complex impedances, the distortion of a waveform across the shunt may be reversed to provide an accurate replica of the undistorted waveform.

9 Claims, 9 Drawing Sheets

(51) Int. Cl.
  *G01R 19/25* (2006.01)
  *G01R 19/00* (2006.01)
  *H03H 7/06* (2006.01)
  *H03H 17/04* (2006.01)
  *G01R 23/165* (2006.01)

(52) U.S. Cl.
  CPC ......... *G06F 17/10* (2013.01); *H03H 17/0202* (2013.01); *G01R 23/165* (2013.01); *H03H 7/06* (2013.01); *H03H 17/04* (2013.01); *H03H 2017/021* (2013.01)

(58) Field of Classification Search
  USPC .................................................. 703/2
  See application file for complete search history.

(56) References Cited

U.S. PATENT DOCUMENTS

| | | | | |
|---|---|---|---|---|
| 5,825,238 | A * | 10/1998 | Poimboeuf | H03H 11/126 327/552 |
| 5,940,441 | A * | 8/1999 | Cranford, Jr. | H03H 11/0433 333/18 |
| 6,055,269 | A * | 4/2000 | Drost | H04L 25/03878 333/18 |
| 6,748,204 | B1 * | 6/2004 | Razavi | H03D 7/1441 327/355 |
| 6,788,067 | B1 * | 9/2004 | Skerritt | G01R 1/203 324/117 R |
| 6,973,288 | B1 * | 12/2005 | Davis | H03G 1/0052 455/169.2 |
| 7,711,510 | B2 * | 5/2010 | Pupalaikis | G01R 23/16 375/226 |
| 7,936,150 | B2 * | 5/2011 | Milios | H02J 7/0031 320/119 |
| 8,058,871 | B2 * | 11/2011 | Guo | G01R 33/098 324/244 |
| 8,350,552 | B1 * | 1/2013 | Marten | G05F 3/30 323/283 |
| 9,052,343 | B2 * | 6/2015 | Marten | G01R 1/203 |
| 2002/0111152 | A1 * | 8/2002 | Razavi | H03D 7/1441 455/326 |
| 2003/0161420 | A1 * | 8/2003 | Pupalaikis | G01R 35/002 375/346 |
| 2004/0008096 | A1 * | 1/2004 | Liu | H03H 11/485 333/214 |
| 2004/0078156 | A1 * | 4/2004 | Kantorovich | G01R 27/16 702/65 |
| 2005/0017760 | A1 * | 1/2005 | Grasso | G01R 1/203 327/50 |
| 2005/0117374 | A1 * | 6/2005 | Sheehy | H02J 3/1842 363/84 |
| 2005/0253651 | A1 * | 11/2005 | Quek | H03F 1/08 330/107 |
| 2009/0167457 | A1 * | 7/2009 | Melde | H01P 5/04 333/32 |
| 2010/0218145 | A1 * | 8/2010 | Engin | G06F 17/5018 716/130 |
| 2011/0074391 | A1 * | 3/2011 | Bartlett | G01R 1/06766 324/76.44 |
| 2011/0089931 | A1 * | 4/2011 | Podlisk | G01R 1/203 324/126 |
| 2011/0267016 | A1 * | 11/2011 | Kajiyama | H02M 3/157 323/271 |
| 2011/0267038 | A1 * | 11/2011 | Homma | G01R 1/203 324/126 |
| 2013/0009655 | A1 * | 1/2013 | Marten | G01R 1/203 324/713 |
| 2013/0057423 | A1 * | 3/2013 | Kurchuk | H03M 1/1215 341/155 |
| 2013/0069632 | A1 * | 3/2013 | Wagoner | G01R 1/203 324/126 |
| 2013/0128396 | A1 * | 5/2013 | Danesh | G01R 19/00 361/45 |
| 2013/0221885 | A1 * | 8/2013 | Hunter | H02P 21/0003 318/400.15 |
| 2013/0222164 | A1 * | 8/2013 | Shiozaki | H03H 15/00 341/122 |
| 2013/0282353 | A1 * | 10/2013 | Tsividis | G06F 17/5036 703/18 |
| 2013/0328547 | A1 * | 12/2013 | Marten | G01R 1/203 324/126 |
| 2014/0139280 | A1 * | 5/2014 | Tsividis | H03K 5/14 327/261 |
| 2014/0162732 | A1 * | 6/2014 | Yin | H03G 3/00 455/571 |
| 2015/0094972 | A1 * | 4/2015 | Tsividis | B60L 58/16 702/63 |
| 2017/0041010 | A1 * | 2/2017 | Weldon | H04L 5/00 |
| 2018/0048324 | A1 * | 2/2018 | Samad | H03M 1/08 |
| 2018/0183320 | A1 * | 6/2018 | Shen | H02M 1/08 |
| 2018/0284159 | A1 * | 10/2018 | Callanan | G01R 19/2506 |

OTHER PUBLICATIONS

Fang Z. Peng ("Harmonic Sources and Filtering Approaches", IEEE, 2001, pp. 18-25) (Year: 2001).*
Karuppanan et al. ("PI and fuzzy logic controllers for shunt active power filter—A report", 2011 ISA. Published by Elsevier Ltd., pp. 163-169) (Year: 2011).*
Chen et al. ("Modeling of Impedance of Rectangular Cross-Section Conductors", IEEE, 2000, pp. 159-162) (Year: 2000).*
Akagi et al. ("Comparisons in Circuit Configuration and Filtering Performance between Hybrid and Pure Shunt Active Filters", IEEE, 2003, pp. 1195-1202) (Year: 2003).*
D. Pradeep kumar ("Investigations on Shunt Active Power Filter for Power Quality Improvement", National Institute of Technology Rourkela 2007, pp. 1-67) (Year: 2007).*
Unnikrishnan et al. ("Shunt hybrid active power filter for harmonic mitigation: A practical design approach",Indian Academy of Sciences, 2015, pp. 1257-1272) (Year: 2015).*
Powerguru, "Thermal Equivalent Circuit Diagrams for Junction Temperature Calculations," Jan. 2013, powerguru.org/thermal-equivalent-circuit-diagrams-for-junction-temperature-calculations/.
Chen et al., "Modeling of impedance of rectangular cross-section conductors," IEEE Conference on Electrical Performance of Electronic Packaging, ieee.org/document/895518/, Oct. 2000.

* cited by examiner

DIGITAL FILTER

Figure 14

COMPENSATING FOR THE SKIN EFFECT IN A SHUNT

CROSS REFERENCE APPLICATIONS

This application claims the benefit of provisional application No. 62/434,352 filed Dec. 14, 2016 and incorporated herein by reference for all purposes.

TECHNICAL FIELD

The present invention relates to filters in electrical systems. More specifically, the invention relates to a compensating filter for correction of a distorted waveform of a voltage signal.

BACKGROUND

In systems which utilize a flow of electrical charge for operation, it is often preferable to know or approximate the amount of electrical charge traveling through a particular element within a circuit contained in the system.

A commonly used method of current measurement involves measuring the total voltage drop across a circuit element. Division of this voltage value by a known value of the circuit element's resistance yields a value for the amount of current passing through the circuit element, by application of Ohm's Law.

The method just described would be suitable for measuring a current across a pure resistor, for example, as the voltage across the resistor would be proportional to the current. However, the method can become less precise when applied across other circuit elements, an example of which would be a current shunt. As commonly used, a current shunt is a piece of material having a known resistance which allows current to flow around a point within a circuit. Shunts may vary in the degree of their complexity, as well as the purpose for which the measurement of current through the shunt is performed.

When a time-varying electric current passes through a conductor, the current passing through a cross-section of the conductor tends to distribute unevenly between the core of the conductor and its surface. This well-known tendency is due to the changing magnetic fields created within the conductor and is referred to as the "skin effect." In a case where accurate measurements of current and voltage are sought after the current has passed through a shunt, the skin effect becomes problematic. This is particularly true when the information sought to be analyzed is not only a simple measurement of voltage across the shunt, but rather measurement of a varying waveform of voltage across the shunt.

In operation, the skin effect may be influenced by a number of factors which may include: the size and shape of the conductor, the material of the conductor and the frequency of the current passing through the conductor. In a current shunt, the presence of the skin effect will result in the impedance of the shunt becoming a complex impedance, determined by these and other factors. Importantly, the complex impedance of a shunt will distort a waveform of a voltage across the shunt relative to the original waveform, resulting in a diminished value of the measured information represented by the waveform. An example of waveform distortion would be the introduction of frequency-dependent effects upon the waveform. Similarly, an accurate representation of a current waveform will also be lost due to the complex impedance caused by the skin effect.

If the original waveform, or even a closer approximation, of the voltage across the shunt were to be recoverable, the current waveform, proportional to the voltage waveform, could then be sampled, measured and analyzed in other ways. Increased accuracy provided by the availability of the original waveform would be highly beneficial, and a method to recover an original waveform from one distorted by the skin effect is sought.

SUMMARY OF THE INVENTION

A method and filter apparatus to compensate for waveform distortion in a shunt due to the skin effect are described. In one of its implementations, the method includes first modeling the shunt as parallel-connected branches of series-connected resistors and inductors to represent complex impedance values of paths through the shunt. It will be understood that the model described below is only an approximate model, used as an example, and other models may be used for the same or similar purpose. Describing the elements of the model begins with formulating an equation setting the inverse of the combined impedance, or admittance, of the filter equal to the summation of the inverses of individual complex impedances, or admittances, of the parallel branches, as follows.

$$\frac{1}{Z_{filter}} = \sum_{n=1}^{N} \frac{1}{R_n + j\omega L_n}$$

With the definitions below, $$k_n = \frac{1}{L_n}$$

$$\omega_{cn} = \frac{R_n}{L_n}$$

the following is true.

$$\frac{1}{R_n + sL_n} = \frac{1/L_n}{s + R_n/L_n} = \frac{k_n}{s + \omega_{cn}}$$

Substitution yields the following expression:

$$\frac{1}{Z_{filter}} = \sum_{n=1}^{N} \frac{k_n}{s + \omega_{cn}}$$

and the shunt may be modeled accordingly.

As previously described, these complex impedances are the result of the skin effect and cause distortion of a waveform measured across the shunt. The disclosed method and apparatus seeks to effectively reverse the distortion caused by the skin effect upon the voltage waveform. To achieve this, a compensating filter is first designed and then applied to the shunt voltage. The disclosed invention provides both an analog compensating filter and a digital compensating filter, about which more will later be said.

By applying the principles of electrical duality, a designer may construct a filter according to the following statement: if the admittance (denoted as Y) of the shunt is the sum of the admittances of a parallel combination of series-connected resistance and inductance combinations, then the impedance (denoted as Z) of the filter can be the sum of the impedances of a series combination of parallel-connected conductance and capacitance combinations, provided that the two are linked so that the shunt admittance and the filter impedance are connected in such a way that the product of the two appears in the resulting transfer function. With the filter constructed, the designer may then make an electrical connection between the shunt and the filter. Allowing the distorted signal from the shunt to pass through the filter results in a corrected form of the voltage signal, which may then provide an accurate replica of the current waveform before it passed through the shunt.

Applications may exist which require a digital filter to correct distortion of a waveform due to the skin effect. Design of such a filter begins by defining a transfer function of the digital filter in the analog domain as follows.

$$H_{filter,a} = \sum_{n=1}^{N} \frac{k_n}{s + \omega_{cn}}$$

It is important to note that this equation is expressed in the analog domain, with s being the Laplace transform variable. In order to express this relationship for use in the digital domain, the bilinear transform is applied to convert from s to z, the z-transform variable, where $$s = \frac{2}{T}\frac{z-1}{z+1}$$

and $$H_{filter,d} = H_{filter,a}\bigg|_{s=\frac{2}{T}\frac{z-1}{z+1}}$$

to yield $$H_{filter,d} = \sum_{n=1}^{N} \frac{k_n}{\left(\frac{2}{T}\frac{z-1}{z+1}\right) + \omega_{cn}}$$

and $$H_{filter,d} = \sum_{n=1}^{N} a_n \frac{1 + z^{-1}}{1 + b_n z^{-1}}$$

$$a_n = \frac{k_n T}{\omega_{cn} T + 2}$$

$$b_n = \frac{\omega_{cn} T - 2}{\omega_{cn} T + 2}$$

through rearranging and defining variables.

Figure 13:
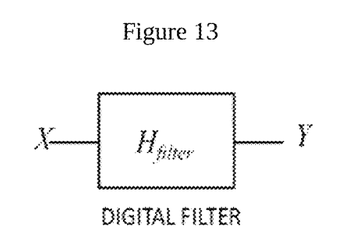
FIG. 13 shows a digital filter.
Figure 14:
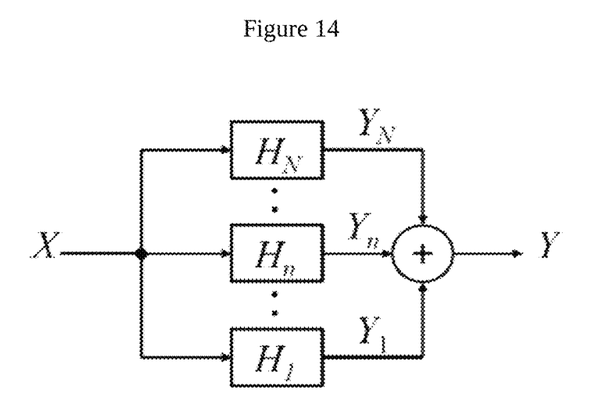
FIG. 14 shows a model of a transfer function of a digital filter.

Similar to the analog filter described previously, if a digital filter is as shown in FIG. 13, then the transfer function of the digital filter may also be modeled as a sum of component transfer functions of parallel paths through the shunt, $$H_{filter,d} = \sum_{n=1}^{N} H_n$$

$$H_n = a_n \frac{1 + z^{-1}}{1 + b_n z^{-1}}$$

and modeled as shown in FIG. 14.

To demonstrate distortion of a waveform by the skin effect and correction of the distorted waveform by the method and apparatus according to the invention, a pulse-width modulation (PWM) driven application will be used as an example throughout. The alert reader will recognize that this method of PWM generation is one of a multitude of possibilities, used for example only, and any other technique of signal generation may be used instead. Numbers are chosen arbitrarily to reveal interesting features and, unless otherwise noted, units are not included in the interest of simplicity.

BRIEF DESCRIPTION OF THE DRAWINGS

The present invention will now be described with reference to several drawings, of which.

DETAILED DESCRIPTION OF THE DRAWINGS

Figure 1:
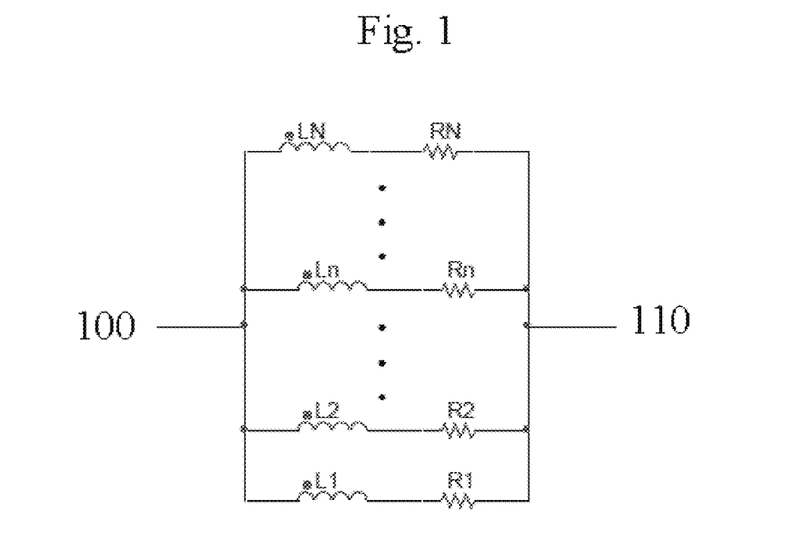
FIG. 1 is an example of a model of complex impedances through a shunt.

A model of complex impedances through a shunt is illustrated in FIG. 1. The model is composed of parallel-connected branches of series-connected resistors and inductors to represent complex impedances of paths through the shunt. The model of FIG. 1 does not include values for the resistors and inductors, but instead demonstrates a framework for modeling the shunt using as many resistor and inductor pairings as required to model a subject shunt, from R1 and L1 through RN and LN. A current enters the shunt at connection point 100 and exits the shunt at connection point 110. A distorted waveform of a voltage across the shunt results.

Figure 2A:
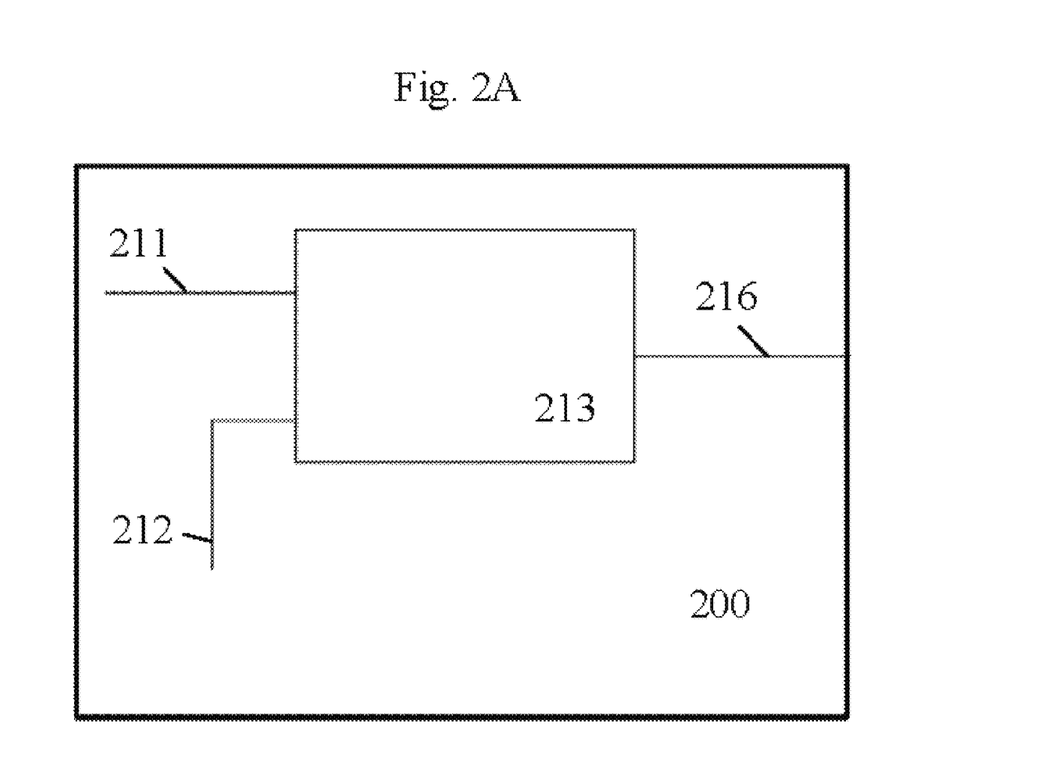
FIG. 2A shows an example of a PWM generator.
Figure 2B:
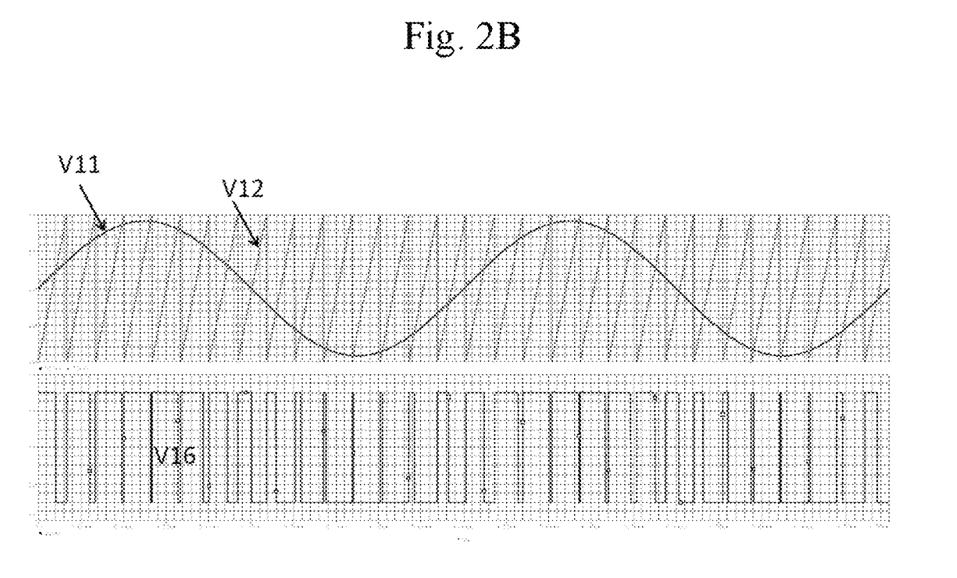
FIG. 2B shows graphs of input signals and an output PWM signal.
Figure 3A:
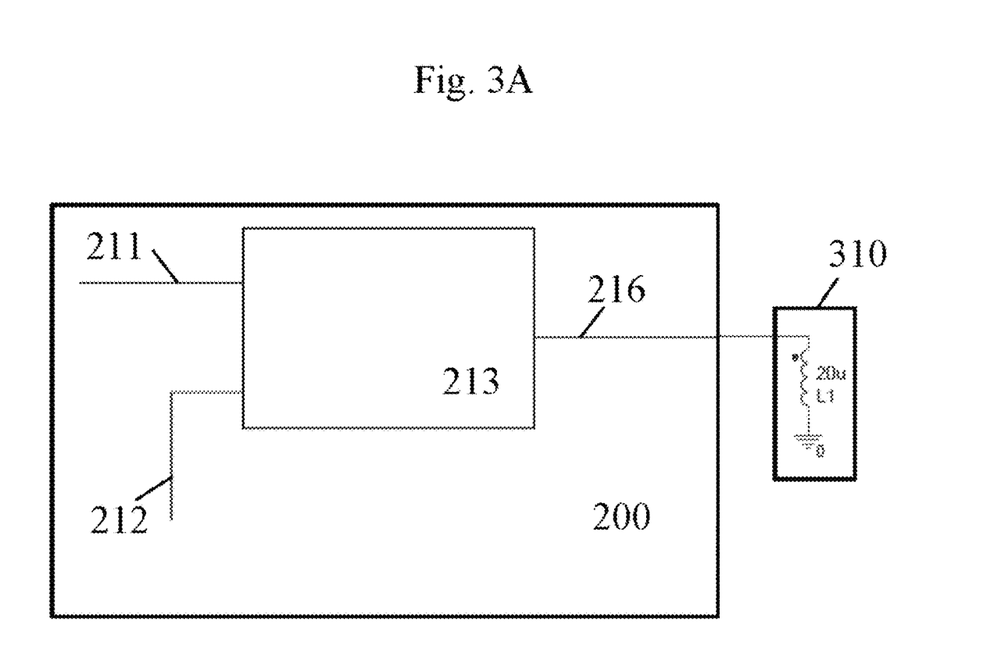
FIG. 3A shows an example of a PWM generator connected to a motor.
Figure 3B:
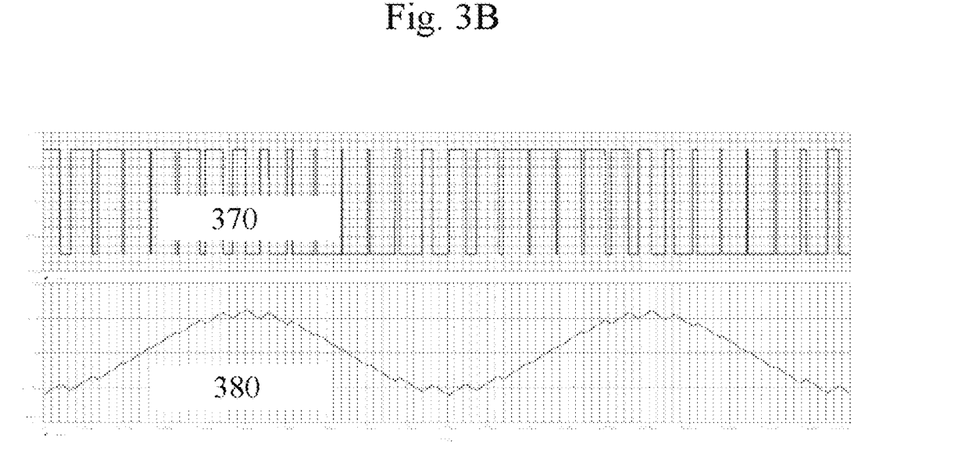
FIG. 3B shows graphs of a motor output voltage and associated motor current driven by a PWM signal.
Figure 4A:
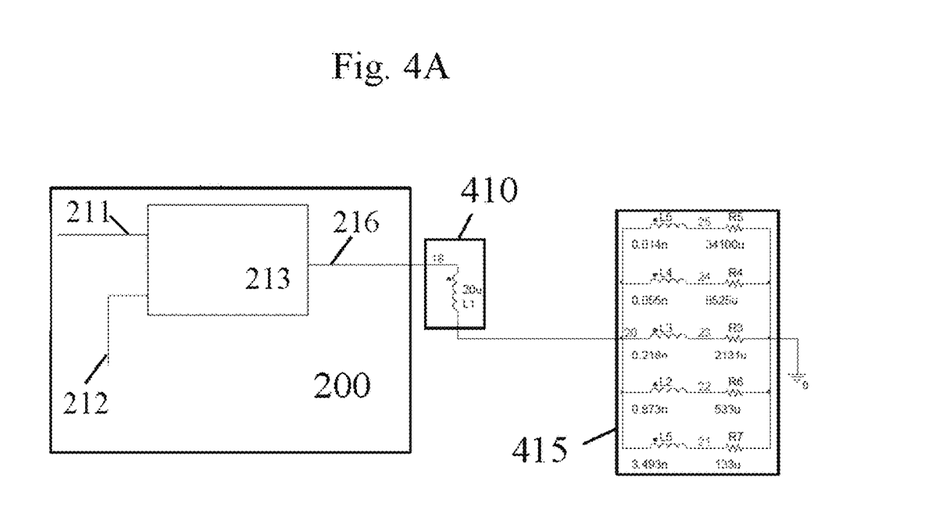
FIG. 4A is an example of a PWM generator driving a motor which delivers a current to a shunt as modeled by a method according to the invention.
Figure 4B:
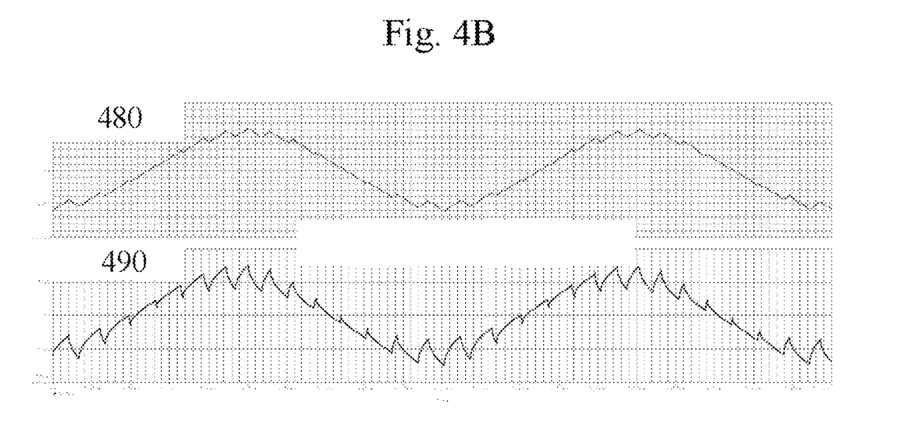
FIG. 4B shows a graph of a motor current delivered to a shunt and a graph of a distored voltage waveform across the shunt due to the skin effect.

FIG. 2A shows a schematic diagram of an example PWM generator 200 used to provide a signal to a motor. An input signal 211 and a sawtooth signal 212 are provided to a comparator 213 and PWM output 216 is generated, with like numerals used throughout the drawings. Graphs of these signals are illustrated in FIG. 2B, with input signal 211 denoted V11, sawtooth signal 212 denoted V12 and PWM output 216 denoted V16. Connection of the PWM generator 200 with a motor 310 is shown in FIG. 3A. Graphs of resulting motor voltage 370 and the motor current 380 delivered to a shunt are shown in FIG. 3B. The complex impedance of the shunt due to the presence of the skin effect is modeled according to an aspect of the invention and shown connected to the motor in FIG. 4A. PWM generator 200 is connected to an input of motor 410 and the current of the motor is connected to a shunt model 415. As noted earlier, the shunt model 415 is composed of parallel-connected branches of series-connected resistors and inductors to represent the complex impedance of the shunt. Once the motor current 480 passes through the shunt model 415, the voltage waveform 490 becomes highly distorted, as shown in the graphs of FIG. 4B.

Figure 5A:
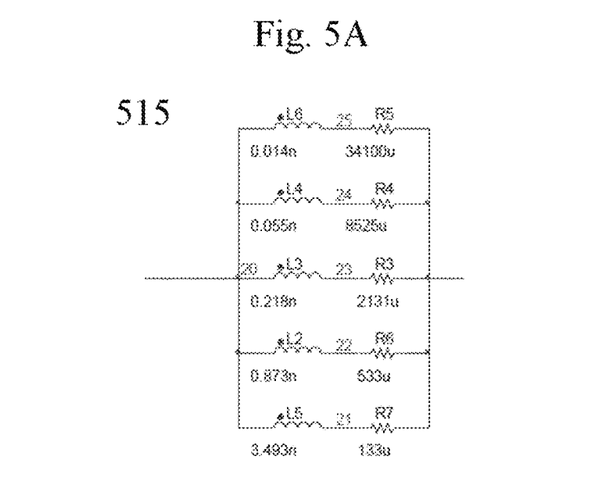
FIG. 5A is an example of a shunt model and associated complex impedances for designing a compensating filter.

As an example, the modeled resistors and inductors of the parallel paths through the shunt model 515 are assigned values, as shown in FIG. 5A. Each parallel path through the shunt is modeled as a series connection of a resistor, R3-R7, with an inductor L2-L6. As mentioned above, design of a compensating filter begins with following the principles of electrical duality, that is, if the admittance (denoted as Y) of the shunt is the sum of the admittances of a parallel combination of series-connected resistance and inductance combinations, then the impedance (denoted as Z) of the filter can be the sum of the impedances of a series combination of parallel-connected conductance and capacitance combinations, provided that the two are linked so that the shunt admittance and the filter impedance are connected in such a way that the product of the two appears in the resulting transfer function. Resistor values for use in the compensating filter are thus calculated and chosen to provide conductance equal to the value of the resistance in the shunt model, and capacitances have values equal to the corresponding inductances in the shunt model.

Figure 5B:
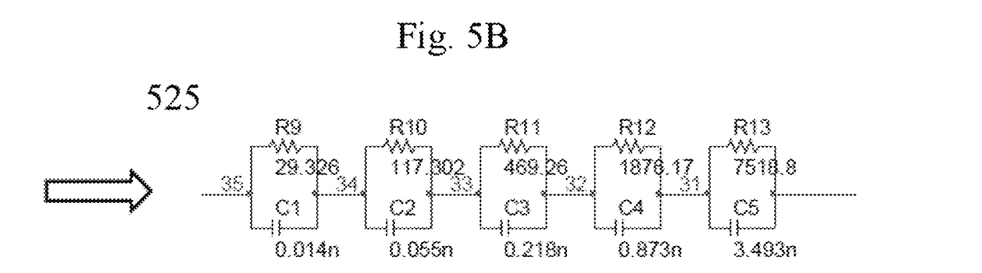
FIG. 5B is an example of a compensating filter according to an aspect of the invention.
Figure 6:
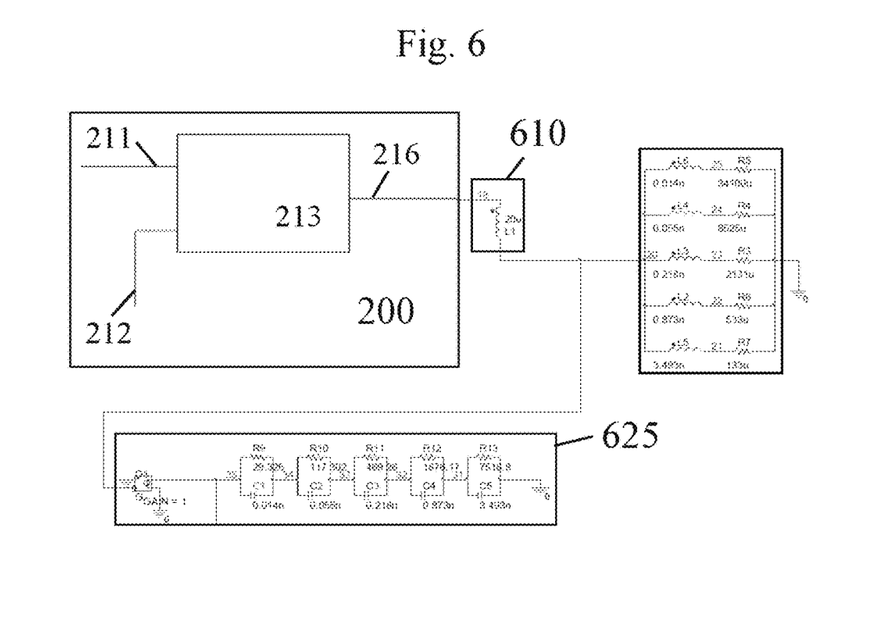
FIG. 6 is an example of a PWM generator driving a motor which delivers a current to a shunt model and correction of the distorted waveform by a method according to the invention.
Figure 7A:
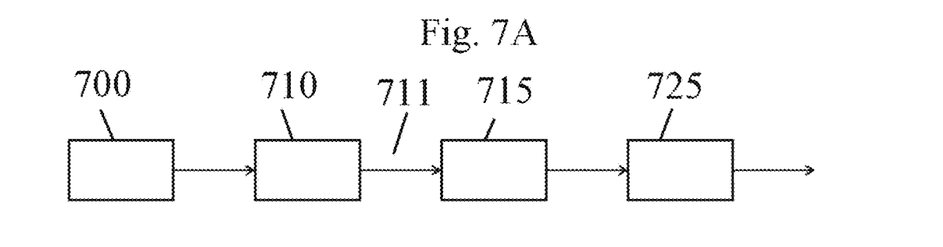
FIG. 7A is a diagram of a system in which a motor current passes through a shunt and the resulting distorted voltage waveform is corrected by application of a filter according to the invention.
Figure 7B:
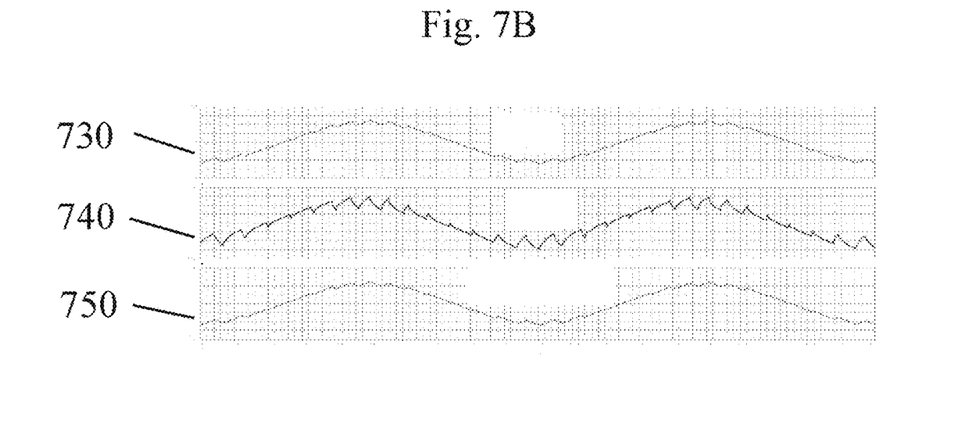
FIG. 7B shows graphs of a waveform of a motor current, a waveform of a voltage measurement across a shunt, and a waveform of the voltage across the shunt, corrected by a method according to the invention.

A compensating filter according to an aspect of the invention may be constructed for the modeled shunt 515 of FIG. 5A. Such a compensating filter 525 is shown in FIG. 5B, with values of resistors R9-R13 and capacitors C1-C5 chosen to compensate for the values of complex impedance in the model of FIG. 5A as explained above. Once constructed, as shown in FIG. 6, the compensating filter 625 may be applied to the voltage from the motor 610. A high-input-impedance voltage-to-current converter may be used to drive the filter. A diagram of this application of the compensating filter to the shunt voltage is shown in FIG. 7A. PWM 700 provides a signal to motor 710 and a motor current 711 enters shunt 715. Compensating filter 725 is applied to a distorted waveform of voltage across the shunt 715. FIG. 7B shows graphs of the motor current waveform 730, the distorted shunt voltage waveform 740 and the corrected shunt voltage waveform 750. As seen in these graphs, the distortion of the shunt voltage waveform 740 due to the skin effect in the shunt is completely compensated by application of a filter according to the invention.

Figure 8:
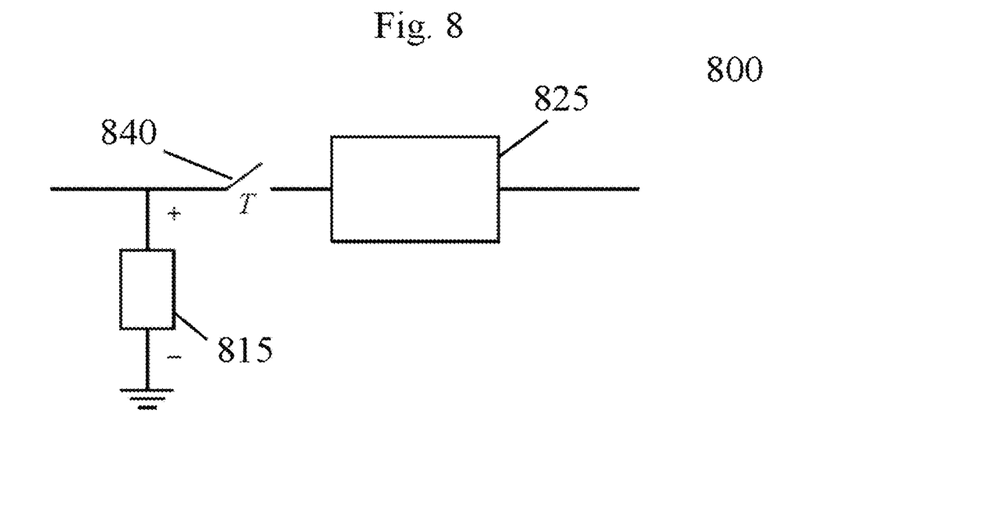
FIG. 8 is an example of a digital filter according to an aspect of the invention applied to correct distortion of a sampled signal of a voltage waveform across a shunt.
Figure 9:
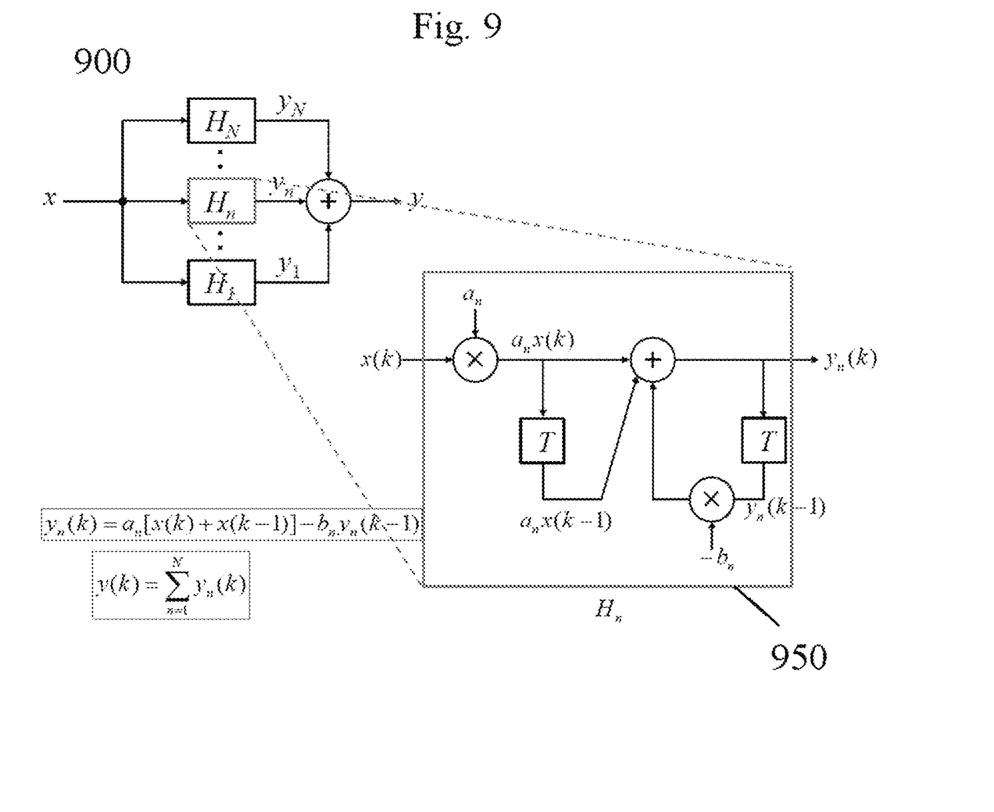
FIG. 9 shows a process to model a component transfer function representing one parallel path through a shunt which distorts a sampled signal of a voltage waveform.

FIG. 8 shows a system 800 containing a digital compensating filter 825 according to an aspect of the invention. Such a digital filter may be executed in software and implemented in an embedded controller. The digital compensating filter 825 receives as input a sampled voltage signal from sampler 840 at a sampling rate of T. As discussed above, the transfer function of the digital filter may also be modeled as a sum of component transfer functions of parallel paths through the shunt 815. An example of such a model is shown in FIG. 9. Compensating digital filter 900 is represented by a parallel connection of component transfer functions $H_1$-$H_N$, as described above. Each path in the sum corresponds to one of the impedances of the resistor-capacitor parallel combinations in compensating filter 625, for example. As shown above, each component transfer function may be defined as follows:

$$H_n = a_n \frac{1+z^{-1}}{1+b_n z^{-1}}$$

$$\frac{Y_n}{X} = a_n \frac{1+z^{-1}}{1+b_n z^{-1}}$$

with $$(1+b_n z^{-1})Y_n = a_n(1+z^{-1})X$$

and $$Y_n = a_n(X + z^{-1}X) - b_n z^{-1} Y_n$$

by rearranging of terms.

Applying these definitions to each component transfer function of the model in design detail 950 shows that $$y_n(k) = a_n[x(k) + x(k-1)] - b_n y_n(k-1)$$

and $$y(k) = \sum_{n=1}^{N} y_n(k)$$

similar to the analog compensating filter described above.

Figure 10:
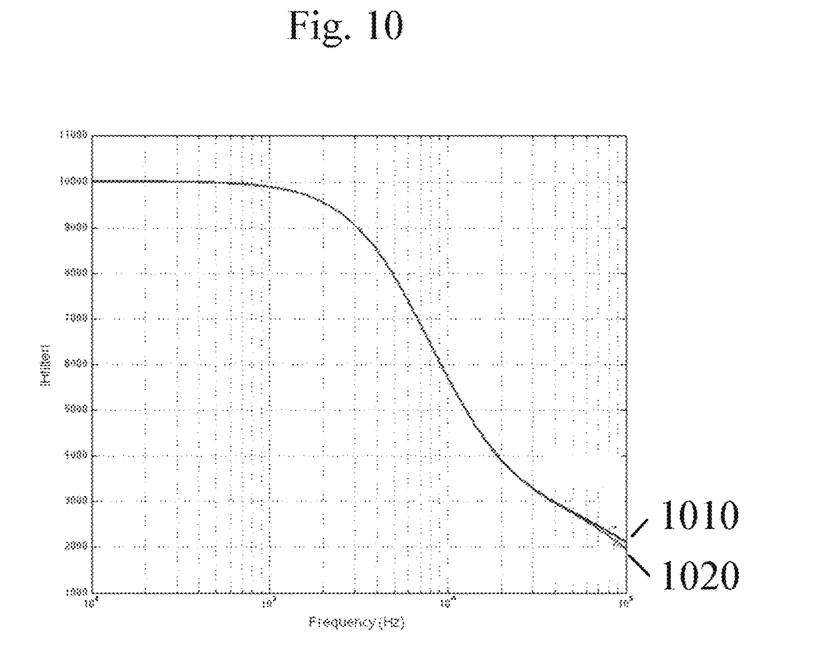
FIG. 10 is a graph comparing the magnitude of the frequency response of a digital filter according to the invention with the magnitude of the frequency response of an analog filter according to the invention.
Figure 11:
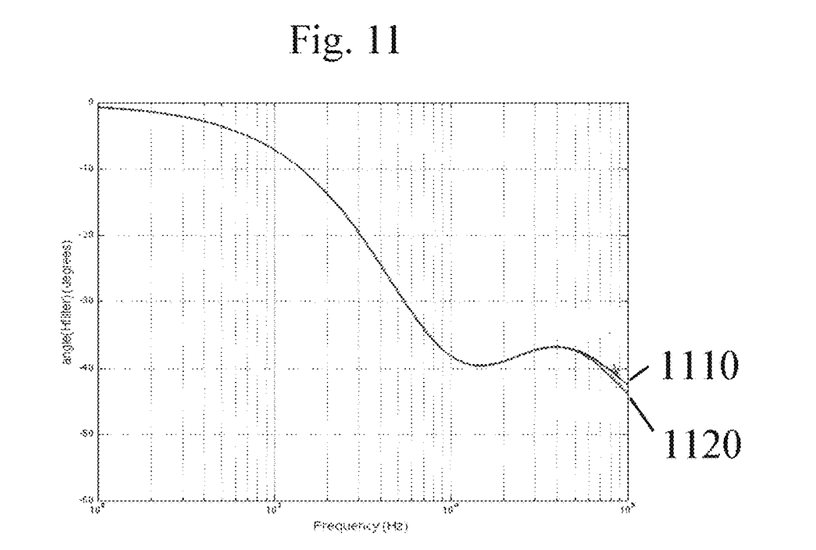
FIG. 11 is a graph comparing the phase of the frequency response of a digital filter according to the invention with the phase of the frequency response of an analog filter according to the invention.

Using the inductor and resistor values of the $5^{th}$-order shunt model of FIG. 5A and a sampling period of T=2 μs, values for $a_n$ and $b_n$ were obtained for the shunt model and digital compensating filter. FIG. 10 shows results for the magnitude of the frequency response 1020 of the digital compensating filter compared with results for the magnitude of the frequency response 1010 of the analog compensating filter. FIG. 11 similarly shows results for the phase of the frequency response 1120 of the digital compensating filter compared with results for the phase of the frequency response 1110 of the analog compensating filter.

Figure 12:
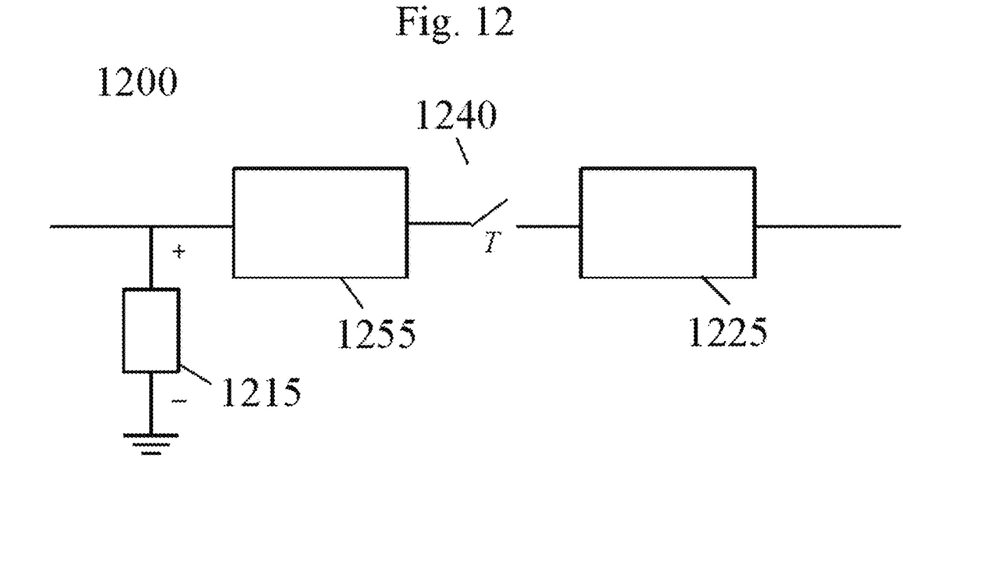
FIG. 12 shows an example of a digital filter system including an antialiasing filter according to an aspect of the invention.

The alert reader will recognize that the digital compensating filter begins to deviate from the analog compensating filter at higher frequencies. To address potential problems such as aliasing at higher frequencies, an analog antialiasing filter may also be included in the design of the digital compensating filter. FIG. 12 shows a system 1200 containing a digital compensating filter 1225 according to an aspect of the invention. The digital compensating filter 1225 receives as input a sampled voltage signal from a sampler 1240 at a sampling rate of T. Sampler 1240 receives a voltage signal from shunt 1215 through antialiasing filter 1255.

It will be appreciated that one skilled in the art of electrical filter design, electrical hardware and software could devise additional obvious improvements and variations upon the invention described and claimed herein. All such obvious improvements and variants are intended to be encompassed by the claims which follow.

What has been described is a method for use with a current shunt, the shunt having a complex impedance, wherein the complex impedance produces frequency-dependent effects upon a voltage waveform across the shunt when passing an electric current through the shunt, the method comprising: modeling the complex impedance of the shunt as a summation of at least two component complex impedances associated with parallel paths through the shunt, thereby creating a shunt model; designing a physical electronic filter corresponding to the shunt model to reverse the frequency-dependent effects of the complex impedance of the shunt on the voltage waveform; physically connecting the filter to the shunt by an electrical connection, thereby applying the filter to the frequency-dependent voltage waveform, wherein the frequency-dependent voltage waveform is transformed into a linear function of the passing current; and reading the transformed value of the passing current.

Also described is an electrical filter apparatus, comprising: a plurality of parallel-connected pairs of components in series, each parallel-connected pair of components comprising: a compensating capacitor having a value of compensating capacitance and a compensating resistor having a value of compensating resistance, wherein the values of compensating resistance are calculated to provide a specific value of conductance and the values of compensating capacitance are calculated to provide a specific value of capacitance; wherein an input of the electrical filter apparatus is connected to an output of a first electrical circuit element.

The invention claimed is:

1. A method for use with a current shunt, the shunt having a complex impedance, wherein the complex impedance produces frequency-dependent effects upon a voltage waveform across the shunt when passing an electric current through the shunt, the method comprising:
    modeling the complex impedance of the shunt as a summation of at least two component complex impedances associated with parallel paths through the shunt, thereby creating a shunt model;
    designing a physical electronic filter corresponding to the shunt model to reverse the frequency-dependent effects of the complex impedance of the shunt on the voltage waveform;
    physically connecting the filter to the shunt by an electrical connection, thereby applying the filter to the frequency-dependent voltage waveform, wherein the frequency-dependent voltage waveform is transformed into a linear function of the passing current; and
    reading the transformed value of the passing current,
wherein the step of modeling the complex impedance of the shunt further comprises:
    modeling the parallel paths through the shunt as a parallel connection of at least two branches, each branch comprising a series connection of an inductor having a value of inductance and a resistor having a value of resistance; and
    assigning a numerical value to the value of inductance and a numerical value to the value of resistance for each branch of the shunt model.

2. The method of claim 1, wherein the physical electronic filter corresponding to the shunt model is an analog filter, and the step of designing a physical electronic filter further comprises
    connecting a plurality of parallel-connected pairs of components in series, each parallel-connected pair of components comprising a compensating capacitor having a value of compensating capacitance and a compensating resistor having a value of compensating resistance.

3. The method of claim 2, wherein the step of designing a physical electronic filter further comprises calculating a value of compensating resistance in order to provide a specific value of conductance and a value of a compensating capacitance.

4. The method of claim 1, wherein the physical electronic filter corresponding to the shunt model further comprises a voltage-to-current converter.

5. The method of claim 1, wherein the physical electronic filter corresponding to the shunt model is a digital filter, and the step of designing a physical electronic filter further comprises:
    defining a system transfer function of the digital filter as a summation of at least two component transfer functions, each associated with a component value of complex impedance;
    defining the at least two component transfer functions as functions of a complex variable in the analog domain; and
    converting the at least two transfer functions defined as functions of a complex variable in the analog domain into functions of a complex variable in the digital domain.

6. The method of claim 5, further comprising sampling the voltage waveform across the shunt over at least two sampling periods at a defined sampling rate, thereby producing sampled signal data.

7. The method of claim 6, wherein the step of applying the filter to the frequency-dependent voltage waveform further comprises:
    providing the sampled signal data as values for use with the functions of a complex variable in the digital domain; and
    solving the functions of a complex variable in the digital domain for the at least two component transfer functions for the defined sampling rate.

8. The method of claim 7, further comprising an antialiasing filter connected between the shunt and the filter, wherein the antialiasing filter rejects frequency components at very high frequencies.

9. The method of claim 5, wherein the digital filter is executed in a software program, and the step of designing a physical electronic filter further comprises implementing the software program in an embedded controller.

* * * * *